(12) United States Patent
Göötz et al.

(10) Patent No.: US 9,496,462 B2
(45) Date of Patent: Nov. 15, 2016

(54) OPTOELECTRONIC SEMICONDUCTOR CHIP

(71) Applicant: OSRAM Opto Semiconductors GmbH, Regensburg (DE)

(72) Inventors: Britta Göötz, Regensburg (DE); Wolfgang Mönch, Pentling (DE); Martin Straßburg, Donaustauf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/760,177

(22) PCT Filed: Dec. 18, 2013

(86) PCT No.: PCT/EP2013/077199
§ 371 (c)(1),
(2) Date: Jul. 9, 2015

(87) PCT Pub. No.: WO2014/108289
PCT Pub. Date: Jul. 17, 2014

(65) Prior Publication Data
US 2015/0349215 A1 Dec. 3, 2015

(30) Foreign Application Priority Data
Jan. 11, 2013 (DE) .......... 10 2013 100 291

(51) Int. Cl.
*H01L 33/08* (2010.01)
*H01L 33/50* (2010.01)
(Continued)

(52) U.S. Cl.
CPC ............ *H01L 33/502* (2013.01); *C09K 11/06* (2013.01); *H01L 27/15* (2013.01); *H01L 33/18* (2013.01);
(Continued)

(58) Field of Classification Search
CPC ............... C08G 2261/5222; C08G 2261/95; H01L 33/08
See application file for complete search history.

(56) References Cited

U.S. PATENT DOCUMENTS 5,966,393 A 10/1999 Hide et al.
8,884,311 B2 11/2014 Bergbauer et al.
(Continued)

FOREIGN PATENT DOCUMENTS

DE 102010020789 A1 11/2011
DE 102010051286 A1 5/2012
(Continued)

OTHER PUBLICATIONS

Lumtec, "Materials for Organic Light Emitting Diode (OLED); Organic Photovoltaics Cell (OPV); Organic Thin-Film Transistor (OTFT); Organic Intermediates; Boronic Acid; ITO Glass Patterning & Components," Luminescence Technology Corp., 2012 Product Catalog, www.lumtec.com.tw, download date: Dec. 3, 2012, 130 pages.

*Primary Examiner* — Daniel Whalen
(74) *Attorney, Agent, or Firm* — Slater Matsil, LLP (57) ABSTRACT

An optoelectronic semiconductor chip includes a number of active elements arranged at a distance from one another. A carrier is arranged transversely of the active elements. The active elements each have a main axis that extends perpendicularly to the carrier and are oriented parallel to one another. A converter material surrounds the active elements on circumferential faces. The converter material includes a conversion substance or a conversion substance and a matrix material. The active elements each have a central core region that is enclosed by at least two layers such that an active layer encloses the core region and a cover layer encloses the active layer. The core region is formed with a first semiconductor material. The active layer includes a light-emitting material. The cover layer is formed with a second semiconductor material and can have a layer thickness between 0.1 nm and 100 n.

17 Claims, 1 Drawing Sheet

(51) Int. Cl.
*H01L 33/32* (2010.01)
*H01L 33/56* (2010.01)
*H01L 27/15* (2006.01)
*C09K 11/06* (2006.01)
*H01L 33/18* (2010.01)
*C08G 61/02* (2006.01)

(52) U.S. Cl.
CPC ............ *H01L 33/32* (2013.01); *H01L 33/505* (2013.01); *H01L 33/507* (2013.01); *H01L 33/56* (2013.01); *C08G 61/02* (2013.01); *C08G 2261/3142* (2013.01); *C08G 2261/3422* (2013.01); *C08G 2261/5222* (2013.01); *C08G 2261/95* (2013.01); *C09K 2211/1416* (2013.01); *H01L 33/08* (2013.01)

(56) References Cited

U.S. PATENT DOCUMENTS

| | | | |
|---|---|---|---|
| 8,969,900 | B2 | 3/2015 | Sabathil et al. |
| 2005/0098205 | A1 | 5/2005 | Roscheisen et al. |
| 2006/0065907 | A1 | 3/2006 | Lee et al. |
| 2006/0138447 | A1 | 6/2006 | Schoo et al. |
| 2008/0036038 | A1 | 2/2008 | Hersee et al. |
| 2008/0191191 | A1 | 8/2008 | Kim |
| 2010/0032645 | A1 | 2/2010 | Choi et al. |
| 2011/0012167 | A1 | 1/2011 | Shimamura et al. |
| 2011/0133100 | A1 | 6/2011 | Kambhampati et al. |
| 2011/0297846 | A1* | 12/2011 | Wang .................... H01J 63/06 250/459.1 |
| 2012/0007042 | A1 | 1/2012 | Hsieh et al. |
| 2012/0132888 | A1 | 5/2012 | Kwak et al. |
| 2012/0161185 | A1 | 6/2012 | Wang |
| 2012/0313078 | A1 | 12/2012 | Fukui et al. |
| 2014/0239327 | A1 | 8/2014 | Konsek et al. |

FOREIGN PATENT DOCUMENTS

| | | |
|---|---|---|
| JP | H11340516 A | 12/1999 |
| JP | 2002090537 A | 3/2002 |
| JP | 2004165683 A | 6/2004 |
| JP | 2005228936 A | 8/2005 |
| JP | 2006093716 A | 4/2006 |
| JP | 2006164938 A | 6/2006 |
| JP | 2006527918 A | 12/2006 |
| JP | 2007246811 A | 9/2007 |
| JP | 2008544567 A | 12/2008 |
| JP | 2009076896 A | 4/2009 |
| JP | 2009542560 A | 12/2009 |
| JP | 2010135858 A | 6/2010 |
| JP | 2011527519 A | 10/2011 |
| JP | 2012015485 A | 1/2012 |
| JP | 2012511240 A | 5/2012 |
| JP | 2012530373 A | 11/2012 |
| WO | 2010065860 A2 | 6/2010 |
| WO | 2010146390 A2 | 12/2010 |
| WO | 2011092647 A2 | 8/2011 |
| WO | 2011105397 A1 | 9/2011 |
| WO | 2012054477 A2 | 4/2012 |

\* cited by examiner

OPTOELECTRONIC SEMICONDUCTOR CHIP

This patent application is a national phase filing under section 371 of PCT/EP2013/077199, filed Dec. 18, 2013, which claims the priority of German patent application 10 2013 100 291.9, filed Jan. 11, 2013, each of which is incorporated herein by reference in its entirety.

TECHNICAL FIELD

The invention relates to an optoelectronic semiconductor chip.

BACKGROUND

Optoelectronic semiconductor chips, such as, for example, light-emitting diodes (LEDs), frequently have outcoupling elements, such as, for example, a potting compound with a conversion substance. Conversion substances convert the radiation emitted by an active layer of the LED into radiation with a modified, for example, longer, wavelength. Excitons, which decay and emit radiation, are here formed in the active layers.

Some of the excitons, however, decay without emitting light, i.e., radiationlessly. The radiationless exciton decay processes in the active layer result in large energy losses. Excitons which decay radiationlessly are thus not used for light emission. Losses furthermore occur in conventional LEDs by reflection of the radiation emitted by the active layer at the converter surface and by absorption of the emitted radiation by the conversion substances and subsequent phonon generation.

SUMMARY

At least one embodiment of the present invention provides an optoelectronic semiconductor chip in which losses due to radiationless exciton decay processes are minimized or virtually completely prevented, so considerably increasing the light yield of the optoelectronic semiconductor chip.

An optoelectronic semiconductor chip is provided. The optoelectronic semiconductor chip comprises a multiplicity of active elements which are arranged at a distance from one another, and a carrier which is arranged transversely of the active elements. The active elements in each case have a main axis which extends perpendicularly to the carrier. The main axes are oriented parallel to one another. The active elements have circumferential faces, wherein at least one converter material surrounds the multiplicity of active elements on the circumferential faces. The converter material comprises a conversion substance or a conversion substance and a matrix material. The active elements in each case have a central core region which is enclosed by at least two layers. An active layer encloses the core region and a cover layer encloses the active layer. The core region is formed with a first semiconductor material and the active layer comprises a light-emitting material. The cover layer is formed with a second semiconductor material and has a layer thickness of between 0.1 nm and 100 nm.

The main axes of the active elements being oriented parallel to one another means that the main axes of the active elements are oriented parallel to one another within the bounds of manufacturing tolerances. The main axes exhibit a deviation in parallelism of 0 to 20%, preferably 0 to 10%, particularly preferably 0 to 5%.

According to one embodiment, the active elements have a greater extent along the main axis than transversely of the main axis. This means that the active elements do not extend by the same amount in each spatial direction, but instead the extent of the active elements parallel to the main axis is greater than that perpendicular to the main axis.

According to one embodiment, the extent of the active elements parallel to the main axis amounts to 1 to 100 µm, preferably 1 to 50 µm, particularly preferably 1 to 10 µm.

The cover layer preferably has a layer thickness of between 0.1 nm and 50 nm, particularly preferably a layer thickness of between 0.1 nm and 10 nm and very particularly preferably a layer thickness of between 0.1 nm and 4 nm. The cover layer preferably has a uniform layer thickness within the bounds of manufacturing tolerances.

According to one embodiment, the active layer and the cover layer are in direct contact with one another. The layer thickness of the cover layer corresponds in this embodiment to the distance from the active layer to the converter material.

According to one embodiment, the cover layer may partially or completely enclose and in so doing partially or completely cover the active layer.

According to one embodiment, the distance from the active layer to the converter material is 0.1 to 100 nm, preferably 0.1 to 50 nm, particularly preferably 0.1 to 10 nm, very particularly preferably 0.1 to 4 nm.

If the distance from the active layer to the converter material is between 0.1 and 100 nm, some of the excitons formed in the active elements, and there in particular in the light-emitting material of the active layer, decay to emit primary electromagnetic radiation and some of the excitons formed are transferred onto the converter material by dipole-dipole interactions.

Here and hereinafter, properties of the converter material may relate to the conversion substance, the matrix material or both.

The radiationless decay events of the excitons in the light-emitting material may be completely or virtually completely prevented, since the excitons, before they decay radiationlesly, are transferred onto the converter material due to its vicinity. The excitons transferred in this manner may then decay radiatively in the converter material to emit secondary electromagnetic radiation. It is also possible for some of the excitons transferred in this manner to be transferred, for example, from the matrix material to the conversion substance and only then to decay to emit the secondary electromagnetic radiation. Energy losses may thus be largely prevented, since the excitons, which decay radiationlessly in conventional optoelectronic devices, may be used to emit secondary radiation in the converter material.

According to one embodiment, transfer of the excitons to the converter material is quicker than the radiationless decay of the excitons in the light-emitting material. Competitive loss processes may thus be largely prevented as a consequence. It is possible for the transfer to proceed within an interval of time of 1 ps to 10 ns, for example, within 1 to 20 ps or 1 to 10 ns. The lifetime of an exciton until radiationless decay conventionally amounts to 1 µs.

It is possible that, through rapid transfer of the excitons, the residence time thereof in the light-emitting material is reduced and thus further excitons may be more quickly formed. This means that within a given interval of time more excitons, which may be used to emit electromagnetic primary and secondary radiation, are available. The light yield and the luminance of the optoelectronic semiconductor chip may thereby be considerably increased.

According to one embodiment of the semiconductor chip, the converter material and the light-emitting material have excited occupied energy levels. The electrons which occupy the excited energy levels are preferably constituents of the excitons which are transferred by the light-emitting material to the converter material. The occupied excited energy levels of the light-emitting material, whose electrons are constituents of the excitons to be transferred, may be at a higher energy level than the occupied excited energy level of the converter material, whose electrons are constituents of the transferred excitons. It is also possible for the location of the occupied excited energy levels of the light-emitting material, whose electrons are constituents of the excitons to be transferred, and of the occupied excited energy level of the converter material, whose electrons are constituents of the transferred excitons, to be the same. The same means that the location of the energy levels differs by at most 2×kT eV. T is the operating temperature and k the Boltzmann constant. In particular, the energy levels adapted in this way of the light-emitting material and the converter material have the same multiplicity. Thus, the probability of transfer of the excitons and thus of the energy increases.

Efficient exciton transfer from the light-emitting material of the active layer to the converter material is thus possible. Preferably, the occupied excited energy levels of the light-emitting material, whose electrons are constituents of the excitons to be transferred, are at a higher energy level than the occupied excited energy levels of the converter material, whose electrons are constituents of the transferred excitons, since in this way reverse transfer of the excitons from the converter material to the light-emitting material is not very probable.

The adapted excited energy levels may be first excited singlet and/or triplet states. It is however also conceivable for other energy levels to be involved in the energy or exciton transfer.

According to one embodiment, the converter material converts the primary electromagnetic radiation at least in part into secondary electromagnetic radiation. At least in part means that the primary electromagnetic radiation is absorbed at least in part by the converter material and emitted as secondary electromagnetic radiation with a wavelength range different from the primary electromagnetic radiation. The primary electromagnetic radiation and/or secondary electromagnetic radiation may comprise one or more wavelengths and/or wavelength ranges in an infrared to ultraviolet wavelength range, in particular in a visible wavelength range. In this respect, the spectra of the primary radiation and/or of the secondary radiation may be narrowband, i.e. the primary radiation and/or the secondary radiation may comprise a monochromatic or approximately monochromatic wavelength range. The spectrum of the primary radiation and/or the spectrum of the secondary radiation may alternatively also be broadband, i.e. the primary radiation and/or the secondary radiation may comprise a polychromatic wavelength range, wherein the polychromatic wavelength range may comprise a continuous spectrum or a plurality of discrete spectral components with various wavelengths.

When superimposed, the primary radiation and the secondary radiation may give the impression of white-colored light To this end, the primary radiation may preferably give the impression of blue-colored light and the secondary radiation the impression of yellow-colored light, which may arise as a result of spectral components of the secondary radiation in the yellow wavelength range and/or spectral components in the green and red wavelength range.

It is also possible for the primary electromagnetic radiation to be completely or virtually completely converted into secondary electromagnetic radiation. The primary electromagnetic radiation is in this case completely or virtually completely absorbed by the converter material and emitted in the form of secondary electromagnetic radiation. The emitted radiation of the optoelectronic device according to this embodiment thus corresponds completely or virtually completely to the secondary electromagnetic radiation. Virtually complete conversion is understood to be conversion greater than 90%, in particular greater than 95%.

It is possible for the primary radiation to be in the UV range and the secondary radiation to give the impression of blue-colored and yellow-colored light, which may arise through spectral components of the secondary radiation in the blue and in the yellow wavelength range and/or spectral components in the blue, green and red wavelength range. The secondary radiation may here give the impression of white-colored light.

According to one embodiment, the electromagnetic secondary radiation is in a blue to infrared wavelength range.

According to one embodiment, the primary radiation may be in the infrared range or in the red range of the electromagnetic spectrum. The secondary radiation may then be in the infrared range of the electromagnetic spectrum.

According to one embodiment, radiative decay of the excitons in the light-emitting material of the active layer results in emission of primary electromagnetic radiation in the UV range to green range, preferably in the UV range to blue range of the electromagnetic spectrum. In other words, the light-emitting material of the active layer emits primary electromagnetic radiation in the UV range to green range, preferably in the UV range to blue range of the electromagnetic spectrum. The light-emitting material of the active layer may also emit primary electromagnetic radiation in the infrared range or in the red range of the electromagnetic spectrum.

In addition to absorption of the primary electromagnetic radiation and subsequent conversion into secondary electromagnetic radiation, decay of the excitons transferred to the converter material also results in emission of secondary electromagnetic radiation which corresponds to that stated above.

According to one embodiment, the light-emitting material is a third semiconductor material. Excitons formed in the semiconductor material have a short lifetime before they undergo radiative decay. As a result, further excitons may be more quickly formed which may be used for light emission by either the third semiconductor material or the converter material. The luminance of the optoelectronic semiconductor chip is consequently raised.

According to one embodiment, the light-emitting material is a material which has an elevated oscillator strength. As a result, these materials have an extended Förster interaction range, i.e. more excitons are transferred from the light-emitting material to the converter material. These may be mixed oxides, selenides and sulfides of group IIA and IIB metals. $(Zn,Mg,Cd)O$, $(Zn,Cd)Se$ or $(Zn,Cd,Mg)S$ is, for example, used.

It is also possible to use InGaAlP or InGaAs as the light-emitting material.

The light-emitting material may, for example, also be based on or consist of a III/V semiconductor material system. For example, the light-emitting material is based on or consists of a nitride semiconductor material system. In particular, the light-emitting material may be based on or consist of GaN, InGaN, AlGaN or AlInGaN. The light-emitting material preferably consists of AlInGaN.

According to one embodiment, the excitons of the light-emitting material of the active layer and the converter material have transition dipole moments which are oriented parallel to one another. Efficient transfer of the excitons onto the converter material is thus possible.

According to one embodiment, the active elements have a diameter perpendicular to the main axis of the active elements, wherein the minimum distance of the active elements from one another is twice as large as the largest diameter thereof. It is also possible for the distance between the active elements to be 20 or 10 µm.

According to one embodiment, the active elements are uniformly distributed on the carrier. This means that, at least within the bounds of manufacturing tolerances, the active elements are uniformly distributed on the carrier.

According to one embodiment, the active elements are, for example arranged in the manner of a regular grid, in other words the active elements are arranged at predetermined distances from one another, for example, in a plan view onto the opposite side of the active elements from the carrier, a regular grid structure, such as, for example, a rectangular grid or a triangular grid structure, is visible. A random distribution of the active elements is, however, also possible.

According to one embodiment, the converter material completely occupies the interspaces between the active elements.

According to one embodiment, the diameter of the active elements perpendicular to the main axis thereof amounts to 1 µm to 2 µm or 2 µm to 4 µm.

According to one embodiment, the converter material and the cover layer are joined to one another via dipole-dipole interactions, electrostatic interaction, hydrogen bridge bonds, van der Waals interactions, steric interactions, entropic interactions or via covalent bonds.

The converter material, in particular the conversion substance and/or the matrix material may comprise UV-curing polymers, thermally curing polymers and/or 2-component polymers or consist of one or more of these polymers.

According to one embodiment, the converter material comprises a conversion substance and a matrix material, the conversion substance being homogeneously distributed in the matrix material. It is also possible for the conversion substance to have a higher concentration in the region adjacent the active elements than in regions of the converter material which are further away from the active elements.

According to one embodiment, the matrix material is selected from a group which comprises silicones, ester-containing polymers, epoxide-containing polymers, amine-containing polymers, polyacetylene-containing polymers, vinyl-containing polymers, carbazole-containing polymers, acrylic-containing polymers, styrene-containing polymers and inorganic hybrid materials or combinations thereof.

According to one embodiment, the conversion substance is a light-emitting polymer, an inorganic luminescent material, an organic molecule or a transition metal complex.

Suitable organic molecules are laser dyes and/or materials which are used in organic light-emitting diodes.

In one embodiment, the organic molecule may be selected from a group of laser dyes which comprises perylenes, coumarins and xanthenes or combinations thereof.

The xanthenes may be rhodamines.

In one embodiment, the perylenes have the following structure wherein R" are selected from a group which comprises H, saturated and unsaturated alkyl residues, completely or partially substituted saturated and unsaturated alkyl residues, aromatics, completely or partially substituted aromatics, fused aromatics, completely or partially substituted fused aromatics, heterocycles, completely or partially substituted heterocycles, fused heterocycles, completely or partially substituted fused heterocycles.

The perylene is preferably

Examples of organic molecules which are used in organic light-emitting diodes are:

(TTPA)

(DCM2)

(rubrene)

(Alq3)

It is also possible for the converter material to comprise a plurality of conversion substances. The converter material may, for example, comprise a light-emitting polymer and an inorganic luminescent material.

The inorganic luminescent material may be a quantum dot. A quantum dot is a material structure which, for example, consists of $10^4$ atoms. Energy levels may here be adjusted by material selection and the shape and size of the quantum dots. Since the quantum dots have a small extent, the active elements may be arranged at a small distance from one another.

According to one embodiment, the inorganic luminescent material is selected from a group which comprises cadmium selenide, cadmium sulfide, indium phoshide, copper indium phosphide, cadmium oxide, indium oxide or copper indium oxide. The luminescent materials may be enveloped with zinc sulfide or zinc selenide.

Transition metal complexes which may be selected are mono- or polynuclear transition metal complexes with transition metals as the central atom/atoms. Mononuclear iridium or platinum complexes are preferably used. Preferred transition metal complexes are iridium complexes. Iridium complexes are particularly preferred. The iridium complexes may have the following structures:

(Ir(ppy)$_3$)

(Ir(ppy)$_2$(acac))

(Ir(piq)$_3$)

A conversion substance which emits the secondary electromagnetic radiation by phosphorescence and/or fluorescence is possible.

According to one embodiment, the light-emitting polymer has a parent structure which emits in the blue spectral range and side chains which emit in the red and/or green and/or yellow and/or orange spectral range. For example, the light-emitting polymer may absorb primary electromagnetic radiation in the UV range or in the UV range to the blue spectral range and emit blue light thanks to the blue parent structure, which blue light is in turn completely or partially emitted by the side chains as secondary radiation in the red and/or green and/or yellow and/or orange spectral range. Excitons of the light-emitting material of the active layer may also be transferred onto the blue parent structure, which excitons are in turn transferred onto the side chains of the polymer where they decay to emit secondary electromagnetic radiation in the red and/or green and/or yellow and/or orange spectral range.

According to one embodiment, the light-emitting polymer comprises a fluorene-containing or a para-phenylene-vinylene-containing polymer.

According to one embodiment, the para-phenylene-vinylene-containing polymer has the following formula:

wherein $R_1$, $R_2$, $R_3$, $R_4$, $R_5$ and $R_6$ may be identically or differently selected and are selected from a group which comprises H, saturated and unsaturated alkyl residues, completely or partially substituted saturated and unsaturated alkyl residues, alkoxy groups, amines, amides, esters, aromatics, completely or partially substituted aromatics, fused aromatics, completely or partially substituted fused aromatics, heterocycles, completely or partially substituted heterocycles, fused heterocycles or completely or partially substituted fused heterocycles. x, y and z may be identically or differently selected and $1 \leq x, y, z \leq 1000$.

According to one embodiment, the para-phenylene-vinylene-containing polymer has the following formula:

wherein $R_{1'}$, $R_{3'}$, $R_{5'}$, and $R_{6'}$ may be identically or differently selected and are selected from a group which comprises H, saturated and unsaturated alkyl residues, completely or partially substituted saturated and unsaturated alkyl residues, aromatics, completely or partially substituted aromatics, fused aromatics, completely or partially substituted fused aromatics, heterocycles, completely or partially substituted heterocycles, fused heterocycles or completely or partially substituted fused heterocycles. x, y and z may be identically or differently selected and $1 \leq x, y, z \leq 1000$ applies.

According to one embodiment, the (para-phenylene vinylene)-containing polymer emits secondary electromagnetic radiation in the yellow range of the electromagnetic spectrum.

Residues $R_{1'}$, $R_{3'}$, $R_{5'}$ and $R_{6'}$ are preferably selected from a group which comprises heterocycles, completely or partially substituted heterocycles, fused heterocycles or completely or partially substituted fused heterocycles. Sulfur-, nitrogen- and/or oxygen-containing heterocycles are particularly preferred. Sulfur- or nitrogen-containing heterocycles are very particularly preferred.

According to one embodiment, the para-phenylene-vinylene-containing polymer has the following formula wherein x, y, z may be identically or differently selected and $1 \leq x, y, z \leq 1000$.

It is possible for the converter material, i.e. the conversion substance and/or the matrix material, to be electrically conductive. If the cover layer is formed with a p-conductive nitride compound semiconductor material, it has relatively low transverse conductivity. The active elements may be contacted on the p-side by means of the electrically conductive converter material. Thanks to the electrically conductive converter material, uniform current feed to the active layer of the active elements is possible.

According to one embodiment, the carrier is that element of the optoelectronic semiconductor chip which mechanically carries and supports the multiplicity of active elements. The carrier may thus, for example, also be that element of the optoelectronic semiconductor chip which joins the multiplicity of active elements to one another.

The carrier may, for example, be a growth substrate for at least parts of the active elements. The carrier may to this end, for example, be formed of GaAs, silicon, glass or sapphire. It is furthermore possible for the carrier to contain at least one of the stated materials. If the carrier is a growth substrate, the growth substrate remains in the semiconductor chip. Thinning the growth substrate, i.e. reducing the thickness of the growth substrate by grinding, etching or chemical-mechanical polishing, is possible.

According to one embodiment, the carrier may at least in part be radiation-opaque, radiation-transmissive, radiation-reflecting or diffusely scattering. This means that the primary radiation generated in the active elements when the semiconductor is in operation and/or secondary electromagnetic radiation generated in the converter material may or may not pass through, be reflected on or scattered by the carrier.

According to one embodiment, the active elements take the form of a cylinder, a truncated cone, a regular truncated pyramid, a regular pyramid with a hexagonal base or the form of a prism, in particular with a hexagonal or triangular base. The main axis is then that direction in which the height of the cylinder, truncated cone, regular truncated pyramid, regular pyramid with a hexagonal base or prism is determined. In other words, the multiplicity of active elements is formed by an elongate three-dimensional body and does not, for example, have the shape of a planar layer. Furthermore, the active elements are not a continuous, unpatterned layer.

According to one embodiment, the first semiconductor material is n-conductive. The first semiconductor material may, for example, be based on an n-doped III/V semiconductor material system. For example, the first semiconductor material is based on an n-doped nitride semiconductor material system. In particular, the first semiconductor material may be based on n-conductive GaN, InGaN, AlGaN or AlInGaN. It is possible for the first semiconductor material to be based on n-conductive InGaAlP or InGaAs.

The core regions of the active elements may have the same type of three-dimensional shape as the active elements. If the active elements, for example, take the form of a cylinder or prism, the core region may also have the shape of a cylinder or prism. The core region may then in particular take the form of a solid body which consists of the first semiconductor material.

The core region may have a diameter perpendicular to the main axis of the active elements of 1 nm to 5 µm, preferably of 1 nm to 1 µm or very particularly preferably of 1 nm to 300 nm. The core region may, for example, have a diameter perpendicular to the main axis of the active elements of 40 nm to 100 nm, of 40 nm to 80 nm or of 40 nm to 60 nm.

According to one embodiment, the core region has a circumferential face which is partially or preferably completely covered by the active layer. The end face of the core region may be covered at least in places. The core region may here directly adjoin the active layer. The active layer preferably has a uniform layer thickness within the bounds of manufacturing tolerances. The layer thickness is 1 to 30 nm, preferably 1 to 10 nm.

The second semiconductor material may be a semiconductor material which is based on the same semiconductor material system as the first semiconductor material, but with another doping. The second semiconductor material may be p-conductive, for example, the second semiconductor material is based on GaN, InGaN, AlGaN or AlInGaN or a stack of two or more layers of two or more of the stated materials.

The multiplicity of active elements may be of identical structure. This means that, at least within the bounds of manufacturing tolerances, the active elements are of identical construction. It is, however, also possible for the optoelectronic semiconductor chip to comprise a multiplicity of active elements which are at least in part of different construction. For example, the active elements may differ from one another in terms of the extent thereof parallel and transversely of the main axis.

The efficiency in particular of gallium nitride-based light-emitting diodes is limited under operating current conditions by the "droop effect". This effect involves a significant decline in efficiency as current or charge carrier density increases. Typical operating currents are therefore distinctly beyond the maximum of the efficiency curve. If higher efficiency is to be achieved at constant current, a reduction in local charge carrier density is therefore advantageous. This could, for example, be achieved by enlarging the cross-sectional area of the optoelectronic semiconductor chip or by increasing the number of active layers. Both approaches are, however, problematic.

Enlarging the cross-sectional area is accordingly, for example, not practical for many applications since such enlargement is accompanied by an increase in etendue. In addition, this solution is also always associated with an increase in costs, which is usually superproportional to the increase in cross-sectional area of the semiconductor chip.

In the optoelectronic semiconductor chip described herein, the active elements, for example, take the form of core/shell nano- or microrods. Because the radiation-emitting region of the optoelectronic semiconductor chip is subdivided into a multiplicity of active elements, thus, for example, a multiplicity of core/shell rods, the active volume in which electromagnetic radiation is generated during operation is increased in comparison with an optoelectronic semiconductor chip which has a single active region, for example, one active layer, and which is, for example, unpatterned. The efficiency of the semiconductor chip is increased in this way.

Due to the fact that an optoelectronic semiconductor chip described herein has a multiplicity of active elements, a significant enlargement of the active area and thus an increase in efficiency is achieved under operating current conditions at reduced charge carrier density. Furthermore, in the case of epitaxial growth of the active elements which are at a distance from one another, it is possible to achieve a reduction in strain in the semiconductor material of the active elements in comparison with a continuous two-dimensional layer.

In particular, it is possible to form the optoelectronic semiconductor chip described herein with two, more than two, more than 100, preferably more than 1000, in particular more than 10000 or more than 100000 active elements.

According to one embodiment, the area of the active layers of the active elements is enlarged. The active layers may comprise cavities. The surfaces of the active layers may also be roughened or provided with a three-dimensional topography. Enlarging the active area leads to an increase in efficiency under operating current conditions at reduced charge carrier density. It is also possible to provide a fractal surface finish on the active layer and/or the cavities located therein. In this case, the nano- or micropatterns of the active layers have similar patterns grow out laterally from the nano- or micropatterns, from which similar patterns in turn grow, resulting in a fractal surface.

According to at least one embodiment of the optoelectronic semiconductor chip, the central core region is enclosed by three layers. It is possible for the cover layer to be enclosed by a first contact layer. The cover layer is here partially or completely covered by the first contact layer. The cover layer and the first contact layer are in particular in direct contact with one another. In operation, the first contact layer is transparent to the primary electromagnetic radiation generated in the active layer. If the cover layer is formed with a p-conductive nitride compound semiconductor material, it has relatively low transverse conductivity. Provision of a first contact layer leads to more uniform current feed of the active layer of the active elements. The first contact layer covers the cover layer, for example, as a layer which, within the bounds of manufacturing tolerances, may have a uniform thickness. The thickness of the first contact layer is 1 to 30 nm, preferably 1 to 10 nm. In this embodiment, the converter material is preferably not electrically conductive.

According to at least one embodiment of the optoelectronic semiconductor chip, the first contact layer is formed of a material which has a large band gap Eg. The band gap Eg is greater than or equal to the shortest wave primary radiation emitted by the active region. For example, Eg is equal to 2.2 eV or 2.0 eV for primary radiation in the red range of the electromagnetic spectrum or 1.5 eV for primary radiation in the infrared range of the electromagnetic spectrum. The band gap Eg is greater than or equal to 4 eV, preferably greater than or equal to 3 eV, particularly preferably greater than or equal to 2.8 eV in the case of primary radiation which is located in the blue range of the electromagnetic spectrum. It may be ensured in this manner that transfer of the excitons from the light-emitting material onto the converter material can proceed unimpeded.

According to at least one embodiment of the optoelectronic semiconductor chip, the first contact layer is formed with a transparent conductive oxide. It is, for example, formed from ITO and/or $Al_{1-x-y}Ga_xIn_yN:Mg$ with $0 \leq x \leq 1$ and $0 \leq y \leq 1$ and $x+y=1$.

According to one embodiment of the optoelectronic semiconductor chip, a second contact layer is in direct contact with the core regions of at least a major part, in particular all, of the active elements of the optoelectronic semiconductor chip, i.e. all the core regions or at least a major part of all the core regions are electrically conductively connected via a single common second contact layer. If the core region is n-conductive, the active elements may be contacted on the n-side by means of the electrically conductive second contact layer.

The second contact layer may here in particular at least in places extend in a plane which extends parallel or substantially parallel to the carrier. The active elements are then arranged between the carrier and the second contact layer.

At least a major part of the active elements here denotes at least 75%, preferably at least 85%, in particular at least 95% of the active elements of the optoelectronic semiconductor chip. Substantially parallel means that the second contact layer extends at least in places in a plane which, within the bounds of manufacturing tolerances, extends parallel to the carrier.

In order to suppress short circuits or current leakage paths, the cover layer and the first contact layer or the cover layer and the converter material are separated from the electrically conductive second contact layer by passivation. The passivation may here be in direct contact with the core region of the active elements and is then located on the side of the active elements remote from the carrier on the circumferential face thereof, for example, in direct contact with the cover layer and the first contact layer or the cover layer and the converter material. The passivation may terminate flush with the side of the core region remote from the carrier and, on the side thereof remote from the carrier, be in direct contact with the second contact layer.

Passivation may, for example, proceed by covering the cover layer and optionally the first contact layer or the converter material with an electrically insulating material or by passivating the semiconductor material of the cover layer, for example, by ion implantation or by electrical deactivation of the dopant species incorporated into the semiconductor material, for example, in the course of a hydrogen-plasma step or by producing surface defects by a back sputtering step.

According to one embodiment of the optoelectronic semiconductor chip, the second contact layer is transmissive or reflective to the primary radiation generated during operation in the active elements and/or to secondary electromagnetic radiation generated by the converter material. This means that the generated primary radiation and/or secondary radiation may pass through the contact layer or is reflected thereon. A transmissive second contact layer may for example be formed with a transparent conductive oxide. Materials such as ITO or ZnO are, for example, suitable. A reflective second contact layer may be formed of metal, for example, with a reflective metal, such as silver, gold, titanium, platinum, palladium, tungsten, osmium and/or aluminum. In the case of a reflective second contact layer, the carrier is preferably radiation-transmissive. At least a major part of the electromagnetic radiation emitted by the optoelectronic semiconductor chip when in operation is then emitted through the carrier.

According to at least one embodiment, the optoelectronic semiconductor chip comprises a reflective layer which is arranged above the carrier on the same side as the multiplicity of active elements. It is here possible for the optoelectronic semiconductor chip to comprise a single reflective layer which joins all the active elements of the optoelectronic semiconductor chip to one another. The active elements may here at least in places directly adjoin the reflective layer.

The semiconductor chip may be produced particularly economically since the necessary process steps and processes for producing the optoelectronic semiconductor chip are possible with three-dimensional crystal structures, for example, three-dimensional core/shell structures. Furthermore, the three-dimensional crystal structures may be contacted by standardized processes since contacting does not itself require resolution in the nanometer range but is instead possible by means of contact layers and/or the converter material which extend over all the active elements. Since a planar epitaxy structure is not required for producing the elements described herein, epitaxial growth may also proceed on unconventional and/or large-area foreign substrates. In particular, electrically insulating growth substrates may be used. Furthermore, gallium nitride-based semiconductor material which is grown in the end panel direction may also be used as the semiconductor material. Differences in the length of the active elements in the direction of the main axis may be compensated by a planarization layer without in so doing impairing the properties of the p-conductive region used for contact to the p-side. It is, however, also possible to dispense with planarization in order to make particularly efficient use of the available active area of each active element.

BRIEF DESCRIPTION OF THE DRAWINGS

Further advantageous embodiments and further developments of the invention are revealed by the exemplary embodiments described below in connection with the figures.

In the exemplary embodiments and figures, identical or identically acting components are in each case provided with the same reference numerals. The elements shown and their size ratios should not be considered as being to scale, but rather individual elements, in particular layer thickness, may be shown exaggeratedly large to assist in understanding.

DETAILED DESCRIPTION OF ILLUSTRATIVE EMBODIMENTS

Figure 1:
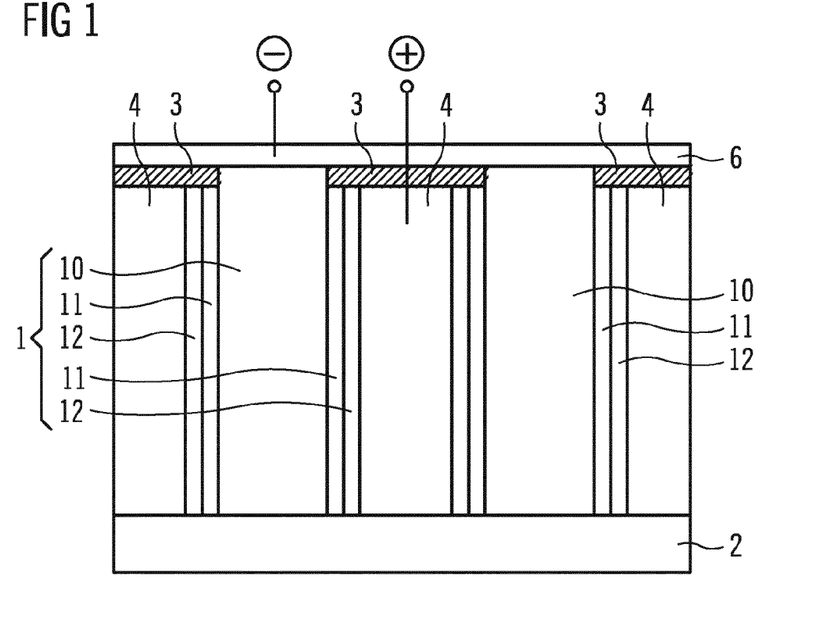
FIG. 1 is a schematic sectional representation of an optoelectronic semiconductor chip described herein.

FIG. 1 shows an optoelectronic semiconductor chip with a carrier 2 which is, for example, a radiation-transmissive, electrically insulating growth substrate such as sapphire or glass. The active elements 1 are arranged on the carrier 2. The active elements 1 in the present case, for example, have the shape of a cylinder. The active elements 1 are, for example, arranged at the grid points of a regular grid, in the present case, for example, of a rectangular grid.

Each of the active elements 1 comprises a core region 10. The core region 10 is in the present case formed with an n-doped GaN-based first semiconductor material. The core region 10 likewise has the shape of a cylinder. The circumferential face of the core region 10 is completely covered by the active layer 11, in which, when the optoelectronic semiconductor chip is in operation, primary electromagnetic radiation is generated.

The active layer 11 has the shape of a hollow cylinder, the inner surface of which is completely covered with the first semiconductor material of the core region 10. The active layer 11 consists of a third polar semiconductor material such as, for example, GaN. The active layer 11 is completely enclosed by a cover layer 12 which is formed with a p-doped GaN-based second semiconductor material.

The interspaces between the active elements 1 are filled in with an electrically conductive converter material 4. The converter material 4, for example, comprises a light-emitting electrically conductive polymer with a parent structure which emits in the blue spectral range and side chains which emit in the yellow spectral range. The distance from the active layer 11 to the converter material 4 is 4 nm.

A second contact layer 6 is arranged on the side remote from the carrier 2 on the active elements 1 and parallel to the carrier 2. The second contact layer 6 is in direct contact with the core regions 10 of all the active elements 1 of the optoelectronic semiconductor chip, such that all the core regions 10 are electrically conductively connected via a single common second contact layer 6. The second contact layer 6 is formed from a reflective metal, such as, for example, silver.

The active elements 1 are contacted via the electrically conductive polymer of the converter material 4 and via the second contact layer 6.

The converter material 4, the cover layer 12 and the active layer 11 are isolated from the electrically conductive second contact layer 6 by passivation 3. The passivation 3 is located above the side of the active elements 1 and the converter material 4 remote from the carrier 2.

The passivation 3 prevents contact between the second contact layer 6 and the p-conductive cover layer 12 and the converter material 4.

Figure 2:
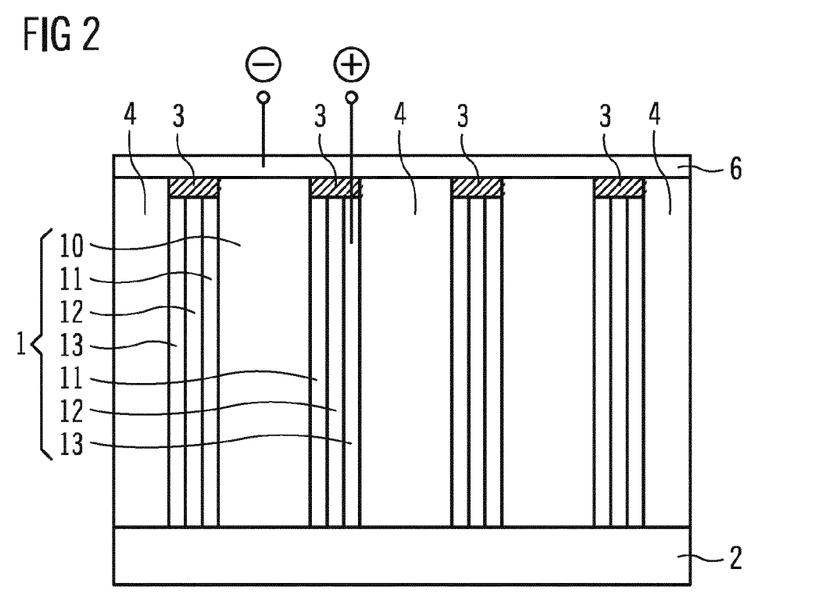
FIG. 2 is a schematic sectional representation of a further optoelectronic semiconductor chip described herein.

FIG. 2 shows an optoelectronic semiconductor chip with a carrier 2 which is, for example, radiation-reflective. The active elements 1 are arranged on the carrier 2. The active elements 1 in the present case, for example, have the shape of a cylinder with a hexagonal base. The active elements 1 are, for example, arranged at the grid points of a regular grid, in the present case, for example, of a triangular grid.

Each of the active elements 1 comprises a core region 10. The core region 10 is in the present case formed with an n-doped GaN-based first semiconductor material. The core region 10 likewise has the shape of a cylinder. The circumferential face of the core region 10 is completely covered by the active layer 11, in which, when the optoelectronic semiconductor chip is in operation, primary electromagnetic radiation is generated.

The active layer 11 has the shape of a hollow cylinder, the inner surface of which is completely covered with the first semiconductor material of the core region 10. The active layer 11 consists of a third polar semiconductor material such as, for example, GaN. The active layer 11 is completely enclosed by a cover layer 12 which is formed with a p-doped GaN-based second semiconductor material.

The cover layer 12 is completely enclosed by a first contact layer 13. In operation, the first contact layer 13 is transparent to the primary electromagnetic radiation generated in the active layer 11.

The interspaces between the active elements 1 are filled in with an electrically non-conductive converter material 4. The converter material 4, for example, comprises a light-emitting electrically conductive polymer with a parent structure which emits in the blue spectral range and side chains which emit in the red and green spectral range. The distance from the active layer 11 to the converter material 4 is 15 nm.

A second contact layer 6 is arranged on the side remote from the carrier 2 on the active elements 1 and parallel to the carrier 2. The second contact layer 6 is in direct contact with the core regions 10 of all the active elements 1 of the optoelectronic semiconductor chip, such that all the core regions 10 are electrically conductively connected via a single common second contact layer 6. The second contact layer 6 is transmissive to the primary radiation generated in the active elements 1 during operation and to secondary radiation generated by the converter material 4. The second contact layer 6 is, for example, formed from ITO.

The active elements 1 are contacted via the first contact layer 13 and the second contact layer 6.

The active layer, the cover layer 12 and the first contact layer 13 are separated from the electrically conductive second contact layer 6 by passivation 3. The passivation 3 is then located on the side of the active elements 1 remote from the carrier 2.

The passivation 3 prevents contact between the second contact layer 6 and the p-conductive cover layer 12 and the first contact layer 13 due to contacting of the second contact layer 6.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. An optoelectronic semiconductor chip comprising:
   a plurality of active elements arranged at a distance from one another;
   a carrier arranged transversely of the active elements, wherein each active element has a main axis that extends perpendicularly to the carrier, and the main axes of the active elements are oriented parallel to one another; and
   a converter material that surrounds the active elements on circumferential faces, the converter material comprising a conversion substance or a conversion substance and a matrix material;
   wherein each active element has a central core region enclosed by at least two layers, wherein an active layer encloses the core region and a cover layer encloses the active layer;
   wherein the core region is formed with a first semiconductor material;
   wherein the active layer comprises a light-emitting material;
   wherein the cover layer is formed with a second semiconductor material;
   wherein the cover layer has a layer thickness between 0.1 nm and 100 nm; and
   wherein the thickness of the cover layer corresponds to the distance from the active layer to the converter material.

2. The semiconductor chip according to claim 1, wherein excitons form in the light-emitting material of the active layer, some of which decay radioactively to emit primary electromagnetic radiation and some of which is transferred onto the converter material via dipole-dipole interactions.

3. The semiconductor chip according to claim 2, wherein radiative decay of the excitons of the light-emitting material of the active layer results in emission of primary electromagnetic radiation in a UV to green range of an electromagnetic spectrum, in an infrared range of the electromagnetic spectrum or in a red range of the electromagnetic spectrum.

4. The semiconductor chip according to claim 2, wherein the excitons of the light-emitting material of the active layer and the converter material have transition dipole moments that are oriented parallel to one another.

5. The semiconductor chip according to claim 1, wherein the light-emitting material is a third semiconductor material.

6. The semiconductor chip according to claim 1, wherein the light-emitting material comprises GaN, InGaN, AlGaN or AlInGaN.

7. The semiconductor chip according to claim 1, wherein the active elements have a diameter perpendicular to the main axis of the active elements and wherein a minimum distance of the active elements from one another is twice as large as a largest diameter thereof.

8. The semiconductor chip according to claim 1, wherein the converter material completely occupies interspaces between the active elements.

9. The semiconductor chip according to claim 1, wherein the converter material and the cover layer are joined to one another via dipole-dipole interactions, electrostatic interaction, hydrogen bridge bonds, van der Waals interactions, steric interactions, entropic interactions or via covalent bonds.

10. The semiconductor chip according to claim 1, wherein the matrix material comprises a material selected from the group consisting of silicones, ester-containing polymers, epoxide-containing polymers, amine-containing polymers, polyacetylene-containing polymers, vinyl-containing polymers, carbazole-containing polymers, acrylic-containing polymers, styrene-containing polymers and inorganic hybrid materials and combinations thereof.

11. The semiconductor chip according to claim 1, wherein the conversion substance comprises a light-emitting polymer, an inorganic luminescent material, an organic molecule or a transition metal complex.

12. The semiconductor chip according to claim 11, wherein the conversion substance comprises the light-emitting polymer, and wherein the light-emitting polymer has a parent structure which emits in a blue spectral range and side chains which emit in a red and/or green and/or yellow and/or orange spectral range.

13. The semiconductor chip according to claim 11, wherein the conversion substance comprises the light-emitting polymer, and wherein the light-emitting polymer comprises a fluorene-containing or a para-phenylene-vinylene-containing polymer.

14. The semiconductor chip according to claim 13, wherein the para-phenylene-vinylene-containing polymer has the following formula wherein R1, R2, R3, R4, R5 and R6 is identically or differently selected and are selected from a group which comprises H, saturated and unsaturated alkyl residues, completely or partially substituted saturated and unsaturated alkyl residues, alkoxy groups, amines, amides, esters, aromatics, completely or partially substituted aromatics, fused aromatics, completely or partially substituted fused aromatics, heterocycles, completely or partially substituted heterocycles, fused heterocycles or completely or partially substituted fused heterocycles, and wherein x, y, z is identically or differently selected and $1 \leq x, y, z \leq 1000$.

15. The semiconductor chip according to claim 13, wherein the para-phenylene-vinylene-containing polymer has the following formula wherein R1', R3', R5' and R6' is identically or differently selected and are selected from a group which comprises H, saturated and unsaturated alkyl residues, completely or partially substituted saturated and unsaturated alkyl residues, aromatics, completely or partially substituted aromatics, fused aromatics, completely or partially substituted fused aromatics, heterocycles, completely or partially substituted heterocycles, fused heterocycles or completely or partially substituted fused heterocycles, and wherein x, y, z is identically or differently selected and $1 \leq x, y, z \leq 1000$.

16. The semiconductor chip according to claim 1, wherein the cover layer has a layer thickness between 0.1 nm and 50 nm.

17. The semiconductor chip according to claim 1, wherein the cover layer has a layer thickness between 0.1 nm and 10 nm.

* * * * *